(12) United States Patent
Zhang et al.

(10) Patent No.: US 10,551,976 B2
(45) Date of Patent: Feb. 4, 2020

(54) TOUCH-CONTROL SUBSTRATE, FABRICATION METHOD, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Ming Zhang, Beijing (CN); Guoyong Ma, Beijing (CN); Zouming Xu, Beijing (CN); Ming Hu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 393 days.

(21) Appl. No.: 15/758,173

(22) PCT Filed: Aug. 14, 2015

(86) PCT No.: PCT/CN2015/086944
§ 371 (c)(1),
(2) Date: Mar. 7, 2018

(87) PCT Pub. No.: WO2016/090942
PCT Pub. Date: Jun. 16, 2016

(65) Prior Publication Data
US 2018/0210576 A1    Jul. 26, 2018

(30) Foreign Application Priority Data

Dec. 12, 2014    (CN) .......................... 2014 1 0764105

(51) Int. Cl.
*G06F 3/044*    (2006.01)
*H01L 23/544*    (2006.01)
(Continued)

(52) U.S. Cl.
CPC ............ *G06F 3/044* (2013.01); *G02F 1/1333* (2013.01); *G02F 1/13338* (2013.01);
(Continued)

(58) Field of Classification Search
CPC .......... G06F 3/044; G06F 3/041; G06F 3/047; G06F 3/0446; G06F 3/0443;
(Continued)

(56) References Cited

U.S. PATENT DOCUMENTS 7,825,529 B2 * 11/2010 Horii ...................... H01L 23/544
257/797
8,008,788 B2 * 8/2011 Koketsu ................ H01L 23/544
257/797

(Continued)

FOREIGN PATENT DOCUMENTS

| CN | 101923412 A | 12/2010 |
|---|---|---|
| CN | 103676245 A | 3/2014 |

(Continued)

OTHER PUBLICATIONS

International Search Report dated Aug. 14, 2015, issued in counterpat International Application No. PCT/CN2015/086944 (13 pages).

*Primary Examiner* — Dismery Mercedes
(74) *Attorney, Agent, or Firm* — Westerman, Hattori, Daniels & Adrian, LLP

(57) ABSTRACT

A touch-control substrate, a fabrication method of the touch-control substrate, and a display device including the touch-control substrate are presented. The disclosed touch-control substrate includes a plurality of first electrodes and a plurality of second electrodes. The first and second electrodes (Continued)

are crossly configured and electrically insulated from one another. Each of the first and second electrodes includes a plurality of conductive structures. A mark region (8) has an alignment mark (81) and is located within a region containing the first and second electrodes. At least one of the conductive structures in the mark region (8) is at least partially absent in the mark region (8). The mark region (8) includes at least one transparent conductive element (5) complementing the at least partially absent conductive structure and being electrically connected to a corresponding conductive structure outside the mark region (8) and contained in either one first electrode or one second electrode.

20 Claims, 5 Drawing Sheets

(51) Int. Cl.
*G02F 1/1333* (2006.01)
*G06F 3/041* (2006.01)
*H01L 27/32* (2006.01)

(52) U.S. Cl.
CPC ............ *G06F 3/041* (2013.01); *G06F 3/0443* (2019.05); *G06F 3/0446* (2019.05); *H01L 23/544* (2013.01); *H01L 27/323* (2013.01); *G02F 2001/133354* (2013.01); *G06F 2203/04103* (2013.01); *G06F 2203/04111* (2013.01); *G06F 2203/04112* (2013.01); *H01L 2223/54426* (2013.01)

(58) Field of Classification Search
CPC ......... G06F 3/0412; G06F 2203/04103; G06F 2203/04112; G06F 2203/04111; G06F 1/16; H01L 21/823481; H01L 21/76816; H01L 21/823871; H01L 23/544; H01L 2223/54426; H01L 27/3244; G02F 1/13338; G02F 1/1333; G02F 1/134309; G02F 1/133351; G02F 2001/133354
See application file for complete search history.

(56) References Cited

U.S. PATENT DOCUMENTS

| | | | | |
|---|---|---|---|---|
| 9,269,672 B2* | 2/2016 | Kumagai | ............ | H01L 23/5226 |
| 9,436,334 B2* | 9/2016 | Kida | ........................ | G06F 3/044 |
| 9,470,973 B2* | 10/2016 | Fu | ........................ | H01L 27/1214 |
| 10,203,818 B2* | 2/2019 | Jeon | ........................ | G06F 3/044 |
| 10,224,289 B2* | 3/2019 | Kim | ........................ | H01L 23/544 |
| 2010/0182740 A1 | 7/2010 | Arita | | |
| 2010/0295819 A1* | 11/2010 | Ozeki | ........................ | G06F 3/044 |
| | | | | 345/174 |
| 2012/0081300 A1* | 4/2012 | Chan | ........................ | G06F 3/044 |
| | | | | 345/173 |
| 2015/0261370 A1* | 9/2015 | Yoo | ........................ | G06F 3/0412 |
| | | | | 345/173 |

FOREIGN PATENT DOCUMENTS

| | | |
|---|---|---|
| CN | 104407742 A | 3/2015 |
| CN | 204242148 U | 4/2015 |
| JP | 2011-100326 A | 5/2011 |

\* cited by examiner

TOUCH-CONTROL SUBSTRATE, FABRICATION METHOD, AND DISPLAY DEVICE

CROSS-REFERENCES TO RELATED APPLICATIONS

This application claims the priority of Chinese patent application No. CN201410764105.4, filed on Dec. 12, 2014, the entire content of which is incorporated herein by reference.

FIELD OF THE DISCLOSURE

The present disclosure generally relates to the field of touch control technologies and, more particularly, relates to a touch-control substrate, a fabrication method of the touch-control substrate, and a display device including the touch-control substrate.

BACKGROUND

Conventional touch-control substrate of a touch screen includes a driving electrode and a sensing electrode, which are crossly configured and electrically insulated from one another. When touched by a human body or a stylus, the electric induction (e.g., capacitance) between these two electrodes in the touch control region may be affected. This affection may be used to determine a touch position. To reduce resistance, the driving and sensing electrodes are made of silver, aluminum, and other metals with a low resistance. However, such metals are not transparent.

Metal mesh is then used for the driving and sensing electrodes to provide desired display effect. For example, as shown in FIG. 1, conductive structures 09 are used for driving electrodes 01 and sensing electrodes 02, and may be mesh-shaped, instead of sheet-shaped. In other words, the driving electrodes 01 and the sensing electrodes 02 may include a metal mesh having metal grids with a number of small holes. Because the metal wires in the metal grids are so thin and often invisible to naked eyes, use of metal mesh will not affect the display effect, while still providing conductive function.

The driving electrodes 01 and the sensing electrodes 02 having the metal mesh are disposed in a same layer level. To avoid conduction at the intersection of these two types of electrodes, the conductive structures 09 of one of the electrode types (for example, the driving electrodes 01) are divided into multiple individual conductive structures. Adjacent individual conductive structures 09 in a single driving electrode are electrically connected to each other through conductive bridges 011 made of ITO. An insulating layer may also be formed between the conductive bridges 011 and the conductive structures 09, while the conductive bridges 011 are electrically connected to the conductive structures 09 through first via-holes 03 formed in the insulating layer.

The touch-control substrate is formed by using a patterning process. Obviously, in the patterning process, satisfactory position relationship between already-formed structure and to-be-formed structure or between the mask and the touch-control substrate must be assured. For this purpose, alignment marks are often marked on the touch-control substrate to adjust the position of the mask with respect to the touch-control substrate. To avoid interfering with display function, such alignment marks are positioned outside of display region.

However, under certain circumstances, such alignment marks have to be positioned within a display region. For example, large size touch-control substrate with multiple regions for separate exposures may have an exposure region disposed entirely inside the display region. In this case, the alignment mark corresponding to this exposure region has to be positioned inside the display region. Although invisible to naked eyes, metal-mesh-shaped conductive structures may still affect position alignment of the mask because such metal-mesh-shaped conductive structures may be detected by alignment equipment.

As shown in FIG. 2, conventional touch-control substrate has a mark region 08 enclosing an alignment mark 081. The mark region 08 does not include any conductive structures. Consequently, due to the absence of conductive structures in the mark region 08, the mark region does not have any touch sensing (or control) function. Touch control effect of the touch screen is adversely affected.

The disclosed touch-control substrates, fabrication methods thereof, and display devices including a touch-control substrate are directed to at least partially alleviate one or more problems set forth above and other problems in the art.

BRIEF SUMMARY OF THE DISCLOSURE

The present disclosure provides a touch-control substrate, a fabrication method of the touch-control substrate and a display device, directed to solve the problem that the mark region of a conventional touch-control substrate may affect the touch sensing effect.

One aspect of the present disclosure provides a touch-control substrate. The disclosed touch-control substrate includes a plurality of first electrodes and a plurality of second electrodes. The first and second electrodes are crossly configured and electrically insulated from one another. Each of the first and second electrodes includes a plurality of conductive structures. A mark region has an alignment mark and partially overlapping the first and/or second electrodes. At least one of the conductive structures in the mark region is at least partially absent in the mark region. The mark region includes at least one transparent conductive element complementing the at least partially absent conductive structure and being electrically connected to a corresponding conductive structure outside the mark region.

Optionally, each first electrode includes a plurality of first conductive structures that are separated from one another, at least two adjacent first conductive structures are electrically connected by a conductive bridge, the first and second electrodes are arranged in a same layer, and a first insulating layer is disposed between the conductive bridge and disposed in the same layer containing the first and second electrodes. The conductive bridge is electrically connected to each of the two adjacent first conductive structures through a first via-hole formed in the first insulating layer. The transparent conductive element and the conductive bridge are arranged in a same layer. The transparent conductive element is electrically connected to the corresponding conductive structure through a second via-hole formed in the first insulating layer.

Optionally, the transparent conductive element is configured to partially overlap with the corresponding, complemented conductive structure providing an overlapping edge region between the transparent conductive element and the corresponding, complemented conductive structure. The second via-hole formed in the first insulating layer is configured passing through the overlapping edge region.

Optionally, the transparent conductive element and the corresponding, complemented conductive structures connected to the transparent conductive element are formed in a same layer.

Optionally, a light-shielding layer is configured at an edge of the touch-control substrate to conceal wirings of the first and second electrodes, and arranged in a same layer as the alignment mark.

Optionally, the alignment mark is made of an optically transparent material; and a second insulating layer is disposed between the alignment mark and the transparent conductive element in the mark region.

Optionally, the transparent conductive element, electrically connected to the corresponding, complemented conductive structure outside the mark region and contained in either the one first electrode or the one second electrode, has an end away from the connected corresponding, complemented conductive structure with a contour shape same as a corresponding contour shape of a conductive structure adjacent to the connected corresponding, complemented conductive structure in a same electrode.

Optionally, each transparent conductive element is configured outside of the alignment mark, or each transparent conductive element partially overlaps with the alignment mark, or the alignment mark is configured within the transparent conductive element.

Optionally, the mark region is positioned in a display region. Optionally, the conductive structures are made of metallic material. Optionally, each of the plurality of conductive structures includes a mesh, a continuous sheet, a narrow strip, or a combination thereof.

Optionally, adjacent first conductive structures in the plurality of first electrodes are electrically connected by a conductive bridge, four adjacent conductive bridges are centered by the alignment mark and surrounding the mark region, wherein the alignment mark is in a center of the mark region, four transparent conductive elements are configured in the mark region, with two transparent conductive elements each electrically connected to the corresponding, complemented conductive structure outside the mark region and contained in one of the plurality of first electrodes, and with two transparent conductive elements each electrically connected to the corresponding, complemented conductive structure outside the mark region and contained in one of the plurality of second electrodes, and the four transparent conductive elements are centered by the alignment mark.

Optionally, each of the first electrodes and the second electrodes includes a driving electrode or a sensing electrode.

Another aspect of the present disclosure provides a method of fabricating a touch-control substrate by forming a plurality of first electrodes and a plurality of second electrodes. The first and second electrodes are crossly configured and electrically insulated from one another, and each of the first and second electrodes includes a plurality of conductive structures. A mark region is defined to be located within a region containing the first and second electrodes. At least one of the conductive structures is at least partially removed from the mark region. At least one transparent conductive element is formed to complement the removed conductive structure and is electrically connected to a corresponding conductive structure outside the mark region and contained in either one first electrode or one second electrode. An alignment mark is formed in the mark region.

Optionally, the at least one transparent conductive element is formed by a patterning process over a base substrate. Optionally, each first electrode includes a plurality of first conductive structures that are separated from one another. The first and second electrodes are formed in a same layer. A first insulating layer is formed on the same layer containing the first and second electrodes. At least two adjacent first conductive structures are electrically connected by a conductive bridge. The conductive bridge is electrically connected to each of the two adjacent first conductive structures through a first via-hole formed in the first insulating layer. The first insulating layer is between the conductive bridge and the same layer containing the first and second electrodes. The transparent conductive element and the conductive bridge are formed in a single patterning process on the first insulating layer over a base substrate. The transparent conductive element is electrically connected to the corresponding conductive structure through a second via-hole formed in the first insulating layer.

Optionally, the transparent conductive element is configured to partially overlap with the corresponding, complemented conductive structure providing an overlapping edge region between the transparent conductive element and the corresponding, complemented conductive structure. The second via-hole formed in the first insulating layer is configured through the overlapping edge region.

Optionally, a light-shielding layer is formed at an edge of the touch-control substrate to conceal wirings of the first and second electrodes, wherein the alignment mark is formed by an optically transparent material. A second insulating layer is formed between the alignment mark and the transparent conductive element in the mark region.

Optionally, each transparent conductive element is formed outside of the alignment mark, or formed to partially overlap with the alignment mark, or formed to include the alignment mark.

Optionally, a conductive bridge is formed to electrically connect adjacent first conductive structures in the plurality of first electrodes. Four adjacent conductive bridges are configured to be centered by the alignment mark and surrounding the mark region. The alignment mark is in a center of the mark region. Four transparent conductive elements are formed in the mark region, having two transparent conductive elements each electrically connected to the corresponding, complemented conductive structure outside the mark region and contained in one of the plurality of first electrodes, and having two transparent conductive elements each electrically connected to the corresponding, complemented conductive structure outside the mark region and contained in one of the plurality of second electrodes. The four transparent conductive elements are centered by the alignment mark.

Another aspect of the present disclosure provides a display device. The display device includes a display substrate used to display images; and the disclosed touch-control substrate. The display substrate includes a liquid crystal display (LCD) substrate, an organic light-emitting diode (OLED) display substrate, or an electronic paper display substrate.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the invention.

As used herein, the term "arranged in a same layer" refers to a single patterning process used to form different structures (e.g., two structures) in a same layer level or in a single process. The different structures may be made of the same material or having a stacked layer with same stacking order. However, such different structures may or may not exactly be coplanar with each other in the thickness direction. When "arranged in a same layer", the different structures may or may not be integrated or connected together. For example, the different structures may include two or more non-connected, separate structures formed with the same or different materials.

As used herein, the term "patterning process" refers to any process of forming a layer with or without certain patterns. For example, the patterning process may include one or more steps selecting from: forming a material layer, coating a photoresist layer, exposing the photoresist layer, developing the exposed photoresist layer, etching the material film, and removing the photoresist layer. The patterning process may also include using 3D printing and/or other suitable process(es) to form a layer with or without certain patterns.

The present disclosure provides a touch-control substrate, a fabrication method of the touch-control substrate and a display device including the touch-control substrate.

Figure 1:
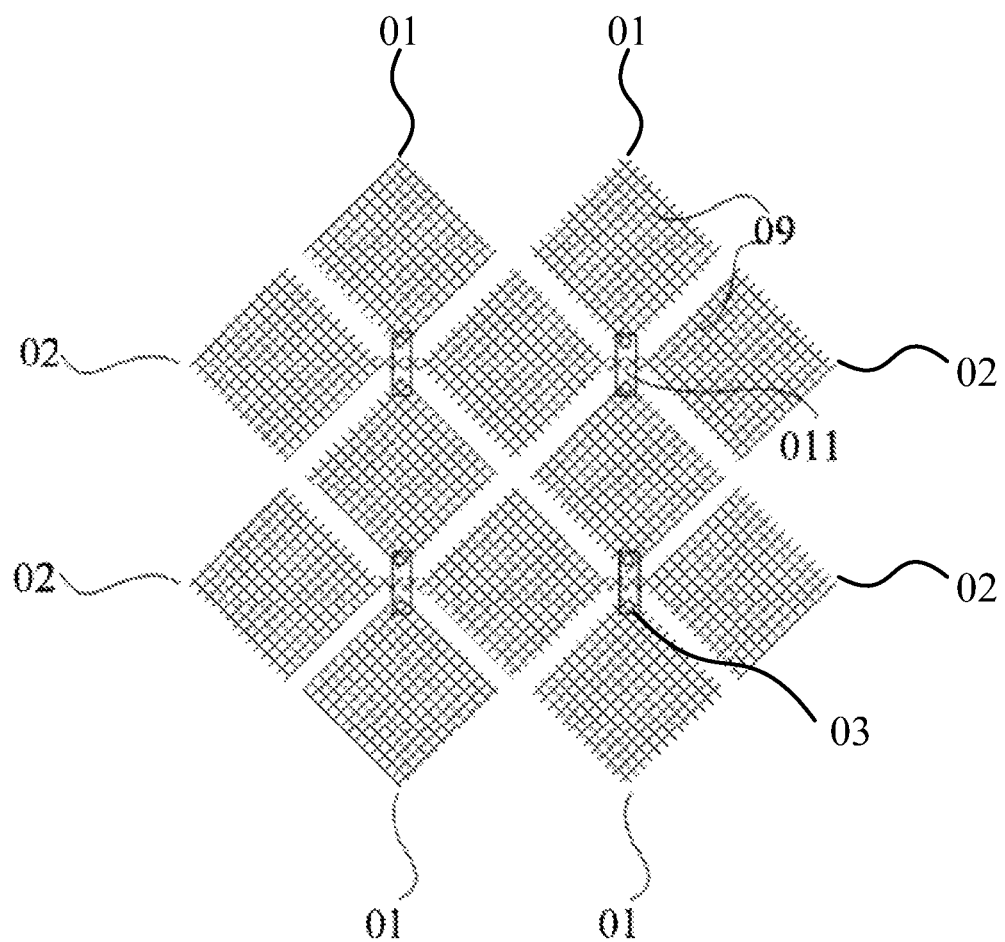
FIG. 1 illustrates a schematic view of a conventional touch-control substrate.
Figure 2:
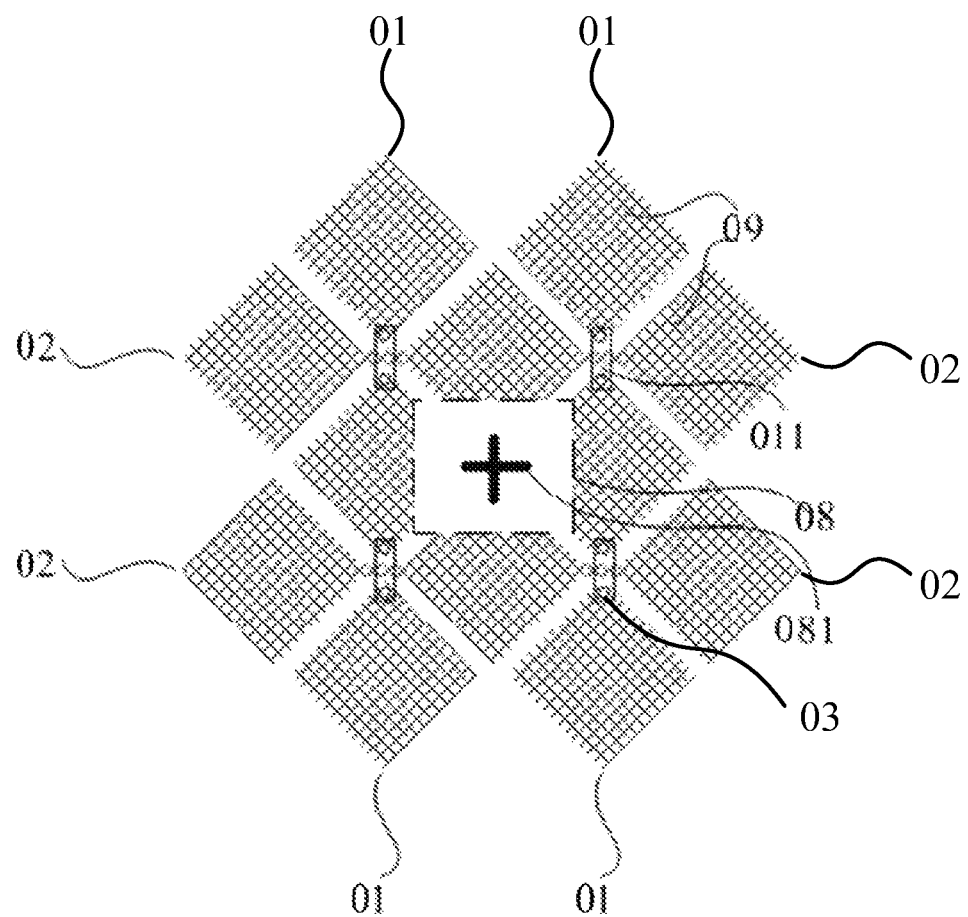
FIG. 2 illustrates a schematic view of a conventional touch-control substrate with a mark region.
Figure 3:
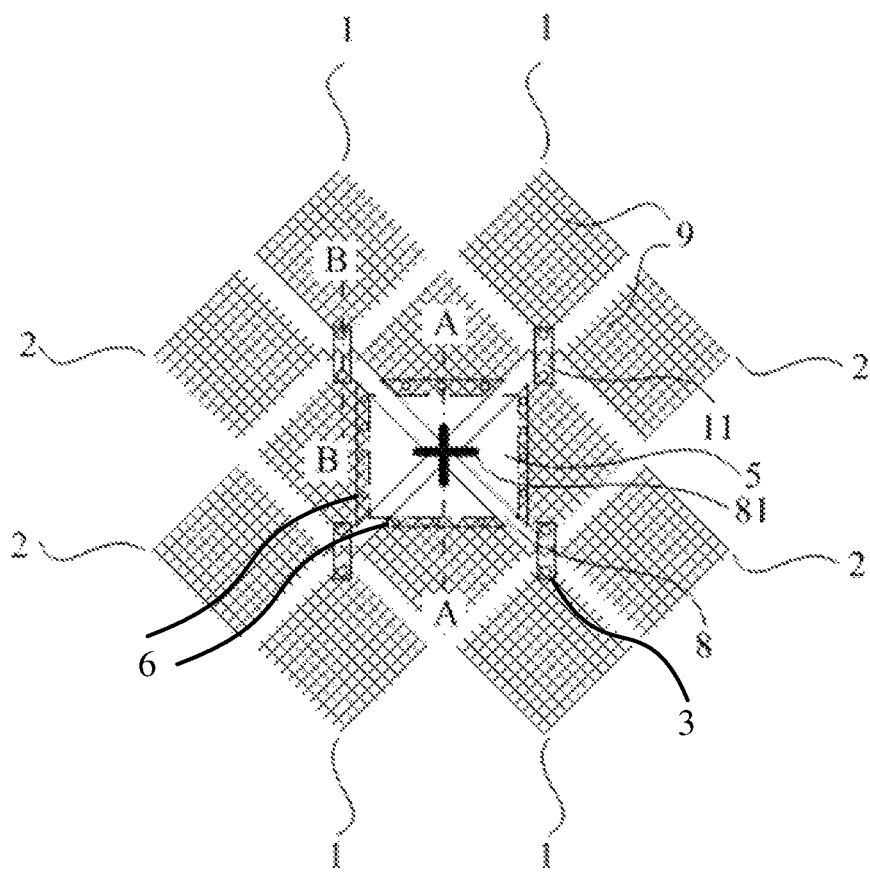
FIG. 3 illustrates a schematic view of an exemplary touch-control substrate according to various exemplary embodiments of the present disclosure.
Figure 4:
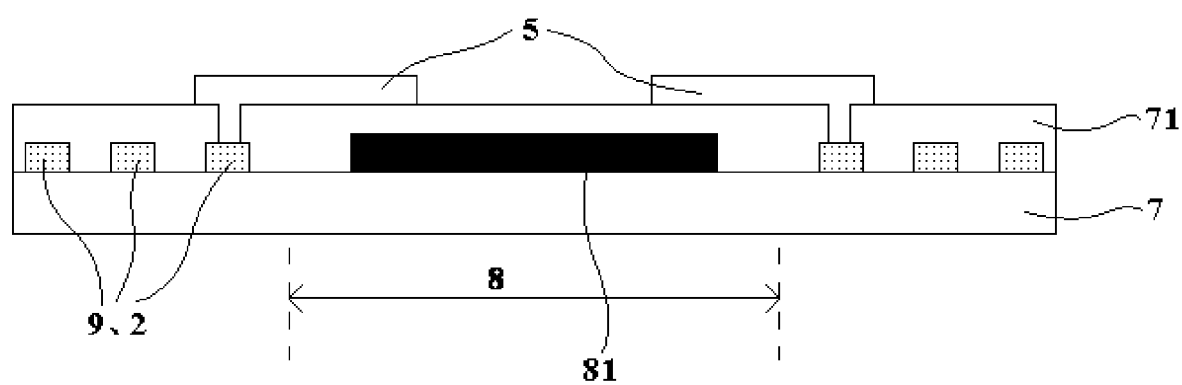
FIG. 4 illustrates a cross sectional schematic view of the exemplary touch-control substrate shown in FIG. 3 in the A-A direction according to various exemplary embodiments of the present disclosure.
Figure 5:
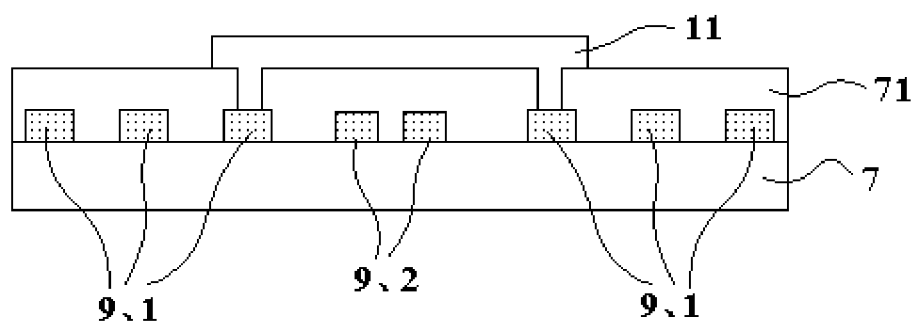
FIG. 5 illustrates a cross sectional schematic view of the exemplary touch-control substrate shown in FIG. 3 in the B-B direction according to various exemplary embodiments of the present disclosure.

FIGS. 3-5 illustrate an exemplary touch-control substrate according to various exemplary embodiments of the present disclosure. As shown in FIGS. 3-5, the exemplary touch-control substrate includes a plurality of first electrodes and a plurality of second electrodes, which are crossly configured and electrically insulated from one another. Each first electrode includes a plurality of conductive structures such as first conductive structures. Each second electrode includes a plurality of conductive structures such as second conductive structures.

In some embodiments, the first conductive structures in each first electrode may be aligned with one another, and the second conductive structures in each second electrode may be aligned with one another. The aligned first conductive structures in the first electrodes may be crossly configured with the aligned second conductive structures in the second electrodes.

For example, a first electrode having aligned first conductive structures may be crossly configured with a second electrode having aligned second conductive structures in any suitable manner, for example, in any suitable angle. In a specific embodiment, the first electrode having aligned first conductive structures may be configured perpendicular to the second electrode having aligned second conductive structures.

The touch-control substrate may include driving electrodes 1 and sensing electrodes 2. Specifically, the first electrodes may be driving electrodes 1 and the second electrodes may be sensing electrodes 2, or vice versa. For illustration purposes, the present disclosure is described using the first electrodes as driving electrodes 1 and the second electrodes as sensing electrodes 2.

In one embodiment, each driving electrode 1 and each sensing electrode 2 may include mesh-shaped conductive structures 9. As disclosed herein, the electrodes of the touch-control substrate according to various embodiments of the present disclosure are in an exemplary form of a mesh (e.g., a metal mesh), although other suitably-shaped conductive structures may also be encompassed in the present disclosure. For example, other suitably-shaped electrodes may be in a form of a continuous sheet, a thread, a narrow strip, etc.

Thus, in a certain embodiment, the conductive structures of the electrodes may only be in a mesh-shaped form made by metal grids with a number of small holes, but may not include a continuous sheet. In other embodiments, some of the electrodes in the touch-control substrate may be in a mesh-shaped form, others of the electrodes may be in a non-mesh shaped form, such as a continuous metal sheet. In still other embodiments, a single electrode type (e.g., either a driving electrode 1 or a sensing electrode 2) may be configured to have a plurality of conductive structures having various shapes combined together. Such shapes may include a mesh, a continuous sheet, a narrow strip, etc., as long as the conductive structures in the single electrode type can be functioned as desired, i.e., a driving electrode or a sensing electrode.

In an embodiment using a mesh shape, the shape of conductive structures 9 is not limited to a regular mesh having parallel lines. Other irregular meshes, for example, formed by dendritic grids, entangled grids, staggered line grid, etc., may be encompassed in the present disclosure for the driving electrodes and sensing electrodes.

In one embodiment, the mesh-shaped conductive structures 9 may be made of metallic material. The metallic material may include a pure metal or metal alloy including, e.g., aluminum, molybdenum, niobium, copper, silver, or other metals, or combinations thereof. In another embodiment, other suitable materials, such as ITO and/or other transparent conductive materials, can be used for the driving and sensing electrodes, without limitation.

Referring back to FIG. 3, the disclosed touch-control substrate may include a mark region 8. The mark region 8 may include an alignment mark 81. The mark region 8 may be arranged inside a display region. In other words, in the display region of the exemplary touch-control substrate, the mark region 8 may be formed to enclose the alignment mark 81, such that the alignment mark 81 in the mark region 8 will not be affected by conductive structures.

It should be noted that the exemplary touch-control substrate in FIG. 3 is configured for illustration purposes, any suitable arrangement for components in FIG. 3 can be encompassed in the present disclosure. More components may be included, and existing components can be omitted, modified, and/or replaced.

For example, the mark region 8 may be defined within a region containing the first and second electrodes. In other words, the mark region 8 may be partially overlapping the first and/or second electrodes. The mark region 8 may include an alignment mark 81. In various embodiments, at least one of the conductive structures in the defined region for the mark region may be at least partially absent in (e.g., removed from) the defined region, and at least one transparent conductive element 5 may be configured to fully or partially complement the at least partially absent conductive structure in the mark region 8.

The term "complementing" defines a relationship between the at least one transparent conductive element and the at least partially absent conductive structure in the mark region. For example, a portion of a conductive structure within the defined region as the mark region may be removed to provide a conductive-structure-absent region along with the remaining conductive structure, i.e., the at least partially absent conductive structure, in the mark region. The conductive-structure-absent region may have a cross-section shape in a direction parallel to the substrate surface.

In one embodiment, a transparent conductive element may be formed to substantially fully cover and match with the cross-section shape of the conductive-structure-absent region, as if to replace the removed portion of the conductive structure, and to substantially fully "complement" the remaining conductive structure. In another embodiment, a transparent conductive element may be formed to cover a portion of the conductive-structure-absent region and to match with the cross-section of the portion of the conductive-structure-absent region to partially "complement" the remaining conductive structure, i.e., the at least partially absent conductive structure.

The transparent conductive element 5 is electrically connected to the corresponding, complemented conductive structure that is outside the mark region 8 and contained in either one first electrode or one second electrode.

It should be noted that the scope of the present disclosure is not limited to arranging the mark region inside the display region. For example, when a mark region is arranged in a non-display region, the touch sensing effect of the touch-control substrate may also be affected due to the presence of the mark region, as disclosed herein. In short, the disclosed touch-control substrate, fabrication method, and/or display device may be applicable to improve touch sensing effect of the touch-control substrate, no matter where the mark region is arranged (e.g., in a display region or in a non-display region) on the touch-control substrate. However, for illustration purposes, the present disclosure is described to have the mark region in a display region as an example.

As shown in FIGS. 3-4, at least one transparent conductive element 5 may be formed in the mark region 8. The at least one transparent conductive element 5 may be formed in the mark region 8 and may be electrically isolated with one another. Each transparent conductive element 5 may be electrically connected to the conductive structure 9 of either the driving electrode 1 or the sensing electrode 2. In a certain embodiment, four electrically-isolated transparent conductive elements may be configured within the mark region 8. The transparent conductive element 5 may be made of ITO, although any suitable optically-transparent conductive element may be used for the transparent conductive element 5. The mark region 8 of the touch-control substrate may thus have at least one transparent conductive element 5 (e.g., made of ITO or other suitable transparent conductive materials), in addition to having an alignment mark 81. The at least one transparent conductive element 5 may be electrically connected to either the driving electrodes 1 or the sensing electrodes 2. Thus, the transparent conductive element 5 may have an electric signal same as the driving electrodes 1 or the sensing electrodes 2. The at least one transparent conductive element 5 may be considered as a part of the driving electrode 1 or a part of the sensing electrode 2, depending on which type of electrode that transparent conductive element 5 is connected to. In this case, the at least one transparent conductive element 5 may function as either a driving electrode or a sensing electrode. The at least one transparent conductive element 5 may enable and improve touch sensing effect in the mark regions 8. Unlike conventional conductive structures configured in a mark region, the at least one transparent conductive element 5 may not affect the function of alignment mark 81 in the mark regions 8.

In one embodiment, when the transparent conductive element 5 connects to the driving electrode 1, the end of the transparent conductive element 5 that is away from the connected conductive structure 9 of the driving electrode 1 has a contour shape same/similar as a corresponding contour shape of the driving electrode in the plurality of driving electrodes 1 in a corresponding position. When the transparent conductive element 5 connects to the sensing electrode 2, the end of the transparent conductive element 5 that is away from the connected conductive structure 9 of the sensing electrode 2 has a contour shape same/similar as a corresponding contour shape of the sensing electrode 2 in the plurality of sensing electrodes 2 in a corresponding position.

For example, as shown in FIG. 3, the position, shape and/or size of each transparent conductive element 5 in the mark region 8 may match the missing part(s) of a corresponding, connected driving electrode conductive structure or match the missing part(s) of a corresponding, connected sensing electrode conductive structure. The transparent conductive element 5 may "repair" the corresponding, connected driving electrode conductive structure or the corresponding, connected sensing electrode conductive structure in the mark region 8 to restore touch sensing effect in the mark region 8, in an extent as much as possible to the driving electrode conductive structures and the sensing electrode conductive structures outside of the mark region 8.

In another embodiment, the at least one transparent conductive element 5 may not perfectly "repair" the driving electrodes 1 or the sensing electrodes 2 in the mark region 8. For example, individual transparent conductive elements may have an area larger or smaller than the missing parts of the corresponding, connected driving electrode conductive structure and corresponding, connected sensing electrode conductive structure. Or individual transparent conductive elements may have a shape different from the missing parts of corresponding conductive structures in the driving electrodes 1 or the sensing electrodes 2.

Moreover, the at least one transparent conductive element 5 may be configured to have various shapes, such as a sheet shape, or a shape other than the sheet-shape. For example, the at least one transparent conductive element 5 may have a grid-shape, a hollow rectangular shape (the alignment mark 81 may be positioned inside the hollow space of this transparent conductive element 5), a shape containing crossed strips (the tips of the strips are electrically connected to the cut position of a corresponding conductive structure), etc.

When strong electric conductivity is needed, the at least one transparent conductive element 5 may have a wider overlapping edge area, overlapped and compared with a connected conductive structure of a driving electrode or a sensing electrode. For example, the at least one transparent conductive element 5 may have an overlapping width greater than (or equal to two or three times of) the diameter of corresponding, connected second via-hole 6 (as shown in FIG. 3) to achieve desirable electric conductivity in order to have a uniform touch sensing effect on the touch-control substrate. In various embodiments, one or more second via-holes may be included in the present disclosure.

As such, the at least one transparent conductive element 5 may take various forms depending on the material properties used to form the at least one transparent conductive element 5. The at least one transparent conductive element 5 may be configured capable of restoring the touch sensing effect of the missing parts of corresponding, connected electrode conductive structure in the mark region 8.

Further, the at least one transparent conductive element 5 may be in a position varying with respect to the alignment mark 81. For example, the alignment mark 81 may be configured outside of the at least one transparent conductive element 5 and may not overlap with the at least one transparent conductive element 5. Alternatively, as shown in FIG. 3, the alignment mark 81 may partially overlap with the at least one transparent conductive element 5. Alternatively, the alignment mark 81 may be positioned inside the at least one transparent conductive element 5. In this case, the alignment mark 81 may be disposed above or under the at least one transparent conductive element 5.

In another embodiment, each driving electrode 1 may include a plurality of conductive structures 9. At least two adjacent conductive structures in the driving electrode 1 (i.e., driving electrode conductive structures) may be electrically connected to each other through a conductive bridge 11, as shown in FIG. 5. The driving electrodes 1 and the sensing electrodes 2 may have their conductive structures 9 formed in the same layer.

The conductive bridge 11 may be electrically insulated from the conductive structures 9 in the sensing electrodes 2 by a first insulating layer 71 disposed there-between. The conductive bridge 11 may be electrically connected to adjacent conductive structures 9 in the driving electrodes 1 through the first via-holes 3 formed in the first insulating layer 71 as shown in FIG. 5.

The at least one transparent conductive element 5 may be disposed in the same layer as the conductive bridge 11. The at least one transparent conductive element 5 in the mark region 8 may be electrically connected to the conductive structures 9 in the sensing electrodes 2 through the one or more second via-holes 6 formed in the first insulating layer 71 as shown in FIGS. 3-4. Further, the at least one transparent conductive element 5 in the mark region 8 may be electrically connected to the conductive structures 9 in the driving electrodes 1 through second via-holes 6 formed in the first insulating layer 71 as shown in FIGS. 3-4.

In a certain embodiment, referring back to FIG. 3, the mark region 8 may not include any conductive structures. The alignment mark 81 is located in a center of the mark region 8. A conductive bridge 11 is configured to electrically connect adjacent first conductive structures in the plurality of driving electrodes 1. For example, four adjacent conductive bridges 11 may be configured and centered by the alignment mark 81 to surround the mark region 8. In addition, four transparent conductive elements 5 may be configured in the mark region 8, with two transparent conductive elements 5 each electrically connected to the corresponding, complemented conductive structure outside the mark region 8 and contained in one of the plurality of driving electrodes 1, and with two transparent conductive elements each electrically connected to the corresponding, complemented conductive structure outside the mark region 8 and contained in one of the plurality of sensing electrodes 2. The four transparent conductive elements 5 may be centered by the alignment mark 81.

Referring back to FIG. 5, when the driving electrodes 1 and the sensing electrodes 2 are formed in a same layer, the driving electrodes 1 may be divided into many individual sections or individual conductive structures (for example, conductive structures 9 in a same driving electrode 1 are separated from one another) to avoid electric connection at the non-contact intersections with the sensing electrodes 2. The separated driving electrode conductive structures may be electrically connected to each other through the conductive bridges 11 (e.g., made of ITO, a metallic material, or other suitable conductive materials). The conductive bridges 11 may be disposed above or under the layer of the conductive structures 9. As illustrated in FIG. 5, the conductive bridges 11 are disposed above the layer of the conductive structures 9. The first insulating layer 71 may be formed on the conductive structures 9. The conductive bridges 11 may be formed on the first insulating layer 71. The conductive bridges 11 may be electrically connected to separate conductive structure 9 in a single driving electrode 1 through the first via-holes 3 formed in the first insulating layer 71.

In this case, the at least one transparent conductive element 5 may be disposed in the same layer as the conductive bridges 11. The at least one transparent conductive element 5 may be electrically connected to individual conductive structures 9 in a single sensing electrode 2 through the second via-holes 6 formed in the first insulating layer 71. Of course, the at least one transparent conductive element 5 may extend slightly beyond the mark region 8 to partially overlap with the conductive structures in the driving or sensing electrodes. The second via-holes 6 may be disposed in the overlapped area in the first insulating layer 71.

As such, the at least one transparent conductive element 5 may be disposed in the same layer as the conductive bridges 11. A single patterning process may be used to form the at least one transparent conductive element 5 and the conductive bridges 11 in a same single process using a corresponding mask.

In the case that the driving electrodes 1 and the sensing electrodes 2 are disposed in separate layers (with an insulating layer in between), an additional step of fabricating the at least one transparent conductive element 5 may be added due to the absence of the concurrent process of fabricating the conductive bridges 11. In this case, the at least one transparent conductive element 5 may be disposed in the same layer as the conductive structures 9. Both the at least one transparent conductive element 5 and the conductive structures 9 may be formed at the same time in a single process. Alternatively, the at least one transparent conductive element 5 may directly overlap with and electrically connect to the conductive structures 9 (without going through the second via-holes 6) in the driving electrode 1 or the sensing electrode 2. In one embodiment, the second via-holes 6 may be omitted.

Figure 6:
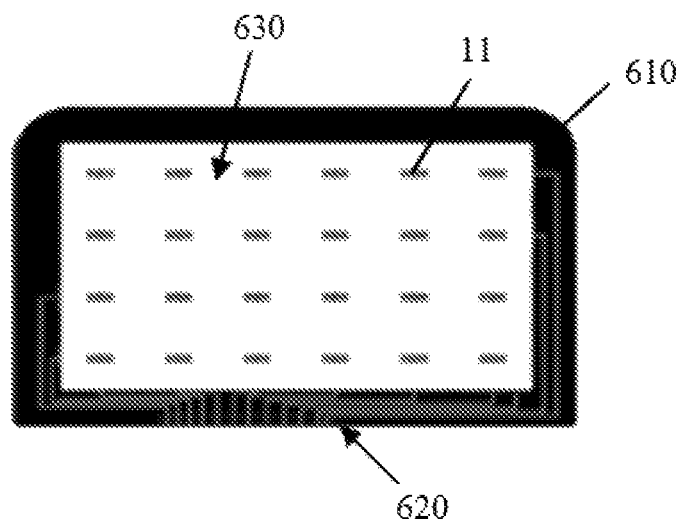
FIG. 6 illustrates a top view of the exemplary touch-control substrate with the light-shielding layer and wirings of the first and second electrodes according to various embodiments of the present disclosure.

In another embodiment, as shown in FIG. 6, the touch-control substrate may include a light-shielding layer 610 in the edge region or formed surrounding the display region. The light-shielding layer 610 may be used to conceal or otherwise cover the wirings 620 of the conductive structures 9 of the driving electrodes 1 and the sensing electrodes 2. The light-shielding layer 610 may be disposed in the same layer as the alignment mark 81. Within the light-shielding layer 610, a stacked layer 630 may be formed, e.g., including the insulating layer 71 stacked on the conductive structures 9.

In other words, as shown in FIG. 4, the light-shielding layer may be disposed outside the display region of the touch-control substrate. The light-shielding layer may be formed on a base substrate 7 of the touch-control substrate. The wirings of the driving electrodes 1 and the sensing electrodes 2 may be disposed between the light-shielding layer and the base substrate 7. Thus, when the end of the touch-control substrate with the light-shielding layer faces toward the display panel, the wirings may be concealed by the light-shielding layer and invisible from outside. When the light-shielding layer is present, the alignment mark 81 may be formed at the same time when forming the light-shielding layer to avoid introducing a separate step of forming the alignment mark 81. Fabrication process may be simplified.

Of course, when the touch-control substrate does not include a light-shielding layer, the alignment mark 81 may be made of the same material used to form the light-shielding layer. Alternatively, the alignment mark 81 may be made of other suitable dark color materials or other color material in distinctive contrast to the at least one transparent conductive element 5.

In another embodiment, the touch-control substrate may include the alignment mark 81 made of a transparent material. The alignment mark 81 may be insulated from the at least one transparent conductive element 5 by a second insulating layer formed between the alignment mark 81 and the at least one transparent conductive element 5 to avoid the electrical contact between the alignment mark 81 and the at least one transparent conductive element 5. The transparent material of the alignment mark 81 may be visible to the detection light of the alignment mark 81.

Obviously, the light-shielding layer is black, opaque and visible to naked eyes. The light-shielding layer may affect the display effect (e.g., a small black dot). Thus, the alignment mark 81 made of a transparent material may avoid affecting the display effect. Although invisible to naked eyes, the transparent material may be detected by a detection light (such as ultra violet UV light, infrared light, etc.) during the alignment process. The alignment mark 81 may be visible and operational from the alignment perspective. In addition, the alignment mark 81 may have a thickness and/or shape different from the at least one transparent conductive element 5 in the mark region 8, the alignment detection of the alignment mark 81 may not be affected by the at least one transparent conductive element 5.

The present disclosure also provides a method of fabricating the disclosed touch-control substrate. For example, a patterning process may be used to form at least one transparent conductive element 5 in a mark region 8.

Figure 7:
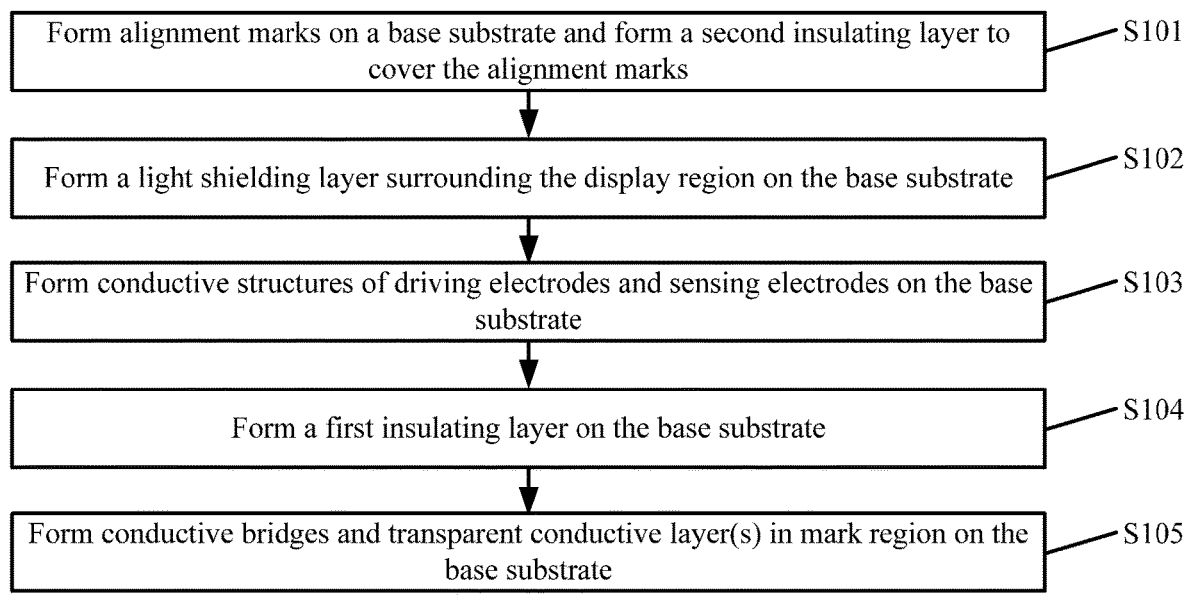
FIG. 7 illustrates a flow chart of an exemplary method for fabricating an exemplary touch-control substrate according to various exemplary embodiments of the present disclosure.

FIG. 7 illustrates a flow chart of an exemplary method for fabricating an exemplary touch-control substrate according to various exemplary embodiments of the present disclosure.

In the Step S101 of FIG. 7, a patterning process is used to form an alignment mark 81 made of a transparent material on the base substrate 7. Then an insulating layer (e.g., the second insulating layer described above) is formed to cover the alignment mark 81. In other words, the alignment mark 81 made of the transparent material may be formed on the base substrate 7 and the second insulating layer may be formed on the alignment marks 81.

In the Step S102 of FIG. 7, a patterning process is used to form a light-shielding layer surrounding the display region on the base substrate 7 having the alignment mark 81 and the insulating layer 71 formed thereon.

The light-shielding layer may be formed surrounding the display region to conceal or cover the electrode wirings at the edge of the touch-control substrate.

In various embodiments, Steps S101 and S102 may be combined to form the alignment mark 81 at the same time when forming the light-shielding layer. Or, the light-shielding layer may be used to form the alignment mark 81.

In one embodiment, regardless of methods for forming the alignment mark 81 using a transparent material or using the light-shielding layer, such alignment mark 81 is formed on the base substrate 7 as a first structure, prepared for subsequently forming other structures, using the alignment mark 81 as a reference structure.

In the Step S103 of FIG. 7, a patterning process is used to form conductive structures 9 of the driving electrodes 1 and the sensing electrodes 2 on the base substrate 7, after forming the alignment mark 81 and/or light-shielding layer.

In other words, a patterning process may be used to form the conductive structures 9 of the driving electrodes 1 and the sensing electrodes 2 in a same layer. The driving electrodes 1 may be divided into separate conductive structures to avoid electric connection at the non-contact intersections with sensing electrodes 2. No conductive structures 9 may be formed in the predefined mark region 8.

In the Step S104 of FIG. 7, a patterning process is used to form a first insulating layer 71 on the base substrate 7 after forming the conductive structures 9.

In other words, the first insulating layer 71 may be formed on the base substrate 7. The first insulating layer 71 may include a plurality of first via-holes 3.

In the Step S105 of FIG. 7, a patterning process is used to form conductive bridges 11 and at least one transparent conductive element 5 (in the mark regions 8) on the first insulating layer 71 and over the base substrate 7.

In other words, a patterning process may be used to form conductive bridges 11 and at least one transparent conductive element 5 in a same layer in a single process. The conductive bridges 11 may be electrically connected to the separated conductive structures 9 in a same driving electrode 1 through the first via-holes 3 formed in the first insulating layer 71. The at least one transparent conductive element 5 positioned in the mark regions 8 may be electrically connected to the conductive structures 9 of the driving electrodes 1 or the sensing electrodes 2 through the second via-holes 6 formed in the first insulating layer 71.

In the Steps of S103 through S105, the driving electrodes 1 and the sensing electrodes 2 may be formed before the conductive bridges 11 and the at least one transparent conductive element 5 are formed. The conductive bridges 11 and the at least one transparent conductive element 5 may be formed above the electrode layer. However, in some cases, the conductive bridges 11 and the at least one transparent conductive element 5 may be formed before forming the driving electrodes 1 and the sensing electrodes 2. For example, the conductive bridges 11 and the at least one transparent conductive element 5 may be formed under the electrode layer including the driving electrodes 1 and the sensing electrodes 2.

Further, in the Steps of S103 through S105, the driving electrodes 1 and the sensing electrodes 2 may be formed in a same layer. When the driving electrodes 1 and the sensing electrodes are not formed in a same layer, the above process may be modified as follows. The driving electrodes 1 and the at least one transparent conductive element 5 electrically connected to the driving electrodes 1 may be formed at the same time. The insulating layer 71 may be formed to cover the driving electrodes 1 and the at least one transparent conductive element 5 electrically connected to the driving electrodes 1. The sensing electrodes 2 and the at least one transparent conductive element 5 electrically connected to the sensing electrodes 2 may be formed at the same time on the insulating layer 71. The specific conditions and parameters of the fabrication process may be modified accordingly.

The present disclosure also provides a display device. The display device includes the disclosed touch-control substrate. In one embodiment, the display device may also include a display substrate for displaying. The touch-control substrate may be disposed on the light emitting end of the display substrate.

Further, the display substrate may be in any display mode, such as a liquid crystal display (LCD) substrate, an organic light-emitting diode (OLED) display substrate, and/or electronic paper display substrate. The display substrate may include thin film transistor (TFT) array substrate, color filter substrate, 3D display substrate, and/or display panel. In other words, the touch-control substrate according to the present disclosure may be disposed on the light emitting end (e.g., having the end of the touch-control substrate with conductive structures facing toward the display substrate) of the display substrate to form the display device with touch sensing function.

Of course, other suitable display structures may be integrated into the touch-control substrate to form the display device or to form an integrated substrate of the display device.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:
1. A touch-control substrate, comprising:
   a plurality of first electrodes;
   a plurality of second electrodes, wherein:
      the first and second electrodes are crossly configured and electrically insulated from one another, and
      each of the first and second electrodes includes a plurality of conductive structures; and
   a mark region having an alignment mark and partially overlapping the first and/or second electrodes, wherein:
      at least one of the conductive structures in the mark region is at least partially absent in the mark region, and
      the mark region includes at least one transparent conductive element complementing the at least partially absent conductive structure and being electrically connected to a corresponding conductive structure outside the mark region.
2. The touch-control substrate of claim 1, wherein:
each first electrode includes a plurality of first conductive structures that are separated from one another,
   at least two adjacent first conductive structures are electrically connected by a conductive bridge,
   the first and second electrodes are arranged in a same layer,
   a first insulating layer is disposed between the conductive bridge and disposed in the same layer containing the first and second electrodes, wherein the conductive bridge is electrically connected to each of the two adjacent first conductive structures through a first via-hole formed in the first insulating layer, and
   the transparent conductive element and the conductive bridge are arranged in a same layer, wherein the transparent conductive element is electrically connected to the corresponding conductive structure through a second via-hole formed in the first insulating layer.
3. The touch-control substrate of claim 2, wherein:
   the transparent conductive element is configured to partially overlap with the corresponding, complemented conductive structure providing an overlapping edge region between the transparent conductive element and the corresponding, complemented conductive structure, and
   the second via-hole formed in the first insulating layer is configured passing through the overlapping edge region.
4. The touch-control substrate of claim 1, wherein:
   the transparent conductive element and the corresponding, complemented conductive structures connected to the transparent conductive element are formed in a same layer.
5. The touch-control substrate of claim 1, further including:
   a light-shielding layer configured at an edge of the touch-control substrate to conceal wirings of the first and second electrodes, and arranged in a same layer as the alignment mark.
6. The touch-control substrate of claim 1, wherein:
   the alignment mark is made of an optically transparent material; and
   a second insulating layer is disposed between the alignment mark and the transparent conductive element in the mark region.
7. The touch-control substrate of claim 1, wherein:
   the transparent conductive element, electrically connected to the corresponding, complemented conductive structure outside the mark region and contained in either the one first electrode or the one second electrode, has an end away from the connected corresponding, complemented conductive structure with a contour shape same as a corresponding contour shape of a conductive structure adjacent to the connected corresponding, complemented conductive structure in a same electrode.
8. The touch-control substrate of claim 1, wherein:
   each transparent conductive element is configured outside of the alignment mark, or
   each transparent conductive element partially overlaps with the alignment mark, or
   the alignment mark is configured within the transparent conductive element.
9. The touch-control substrate of claim 1, wherein the mark region is positioned in a display region.
10. The touch-control substrate of claim 1, wherein the conductive structures are made of metallic material.
11. The touch-control substrate of claim 1, wherein each of the plurality of conductive structures includes a mesh, a continuous sheet, a narrow strip, or a combination thereof.

12. The touch-control substrate of claim 1, wherein:
adjacent first conductive structures in the plurality of first electrodes are electrically connected by a conductive bridge,
four adjacent conductive bridges are centered by the alignment mark and surrounding the mark region, wherein the alignment mark is in a center of the mark region,
four transparent conductive elements are configured in the mark region, with two transparent conductive elements each electrically connected to the corresponding, complemented conductive structure outside the mark region and contained in one of the plurality of first electrodes, and with two transparent conductive elements each electrically connected to the corresponding, complemented conductive structure outside the mark region and contained in one of the plurality of second electrodes, and
the four transparent conductive elements are centered by the alignment mark.

13. The touch-control substrate of claim 1, wherein each of the first electrodes and the second electrodes includes a driving electrode or a sensing electrode.

14. A display device, comprising:
a display substrate used to display images; and
a touch-control substrate according claim 1.

15. A method of fabricating a touch-control substrate, comprising:
forming a plurality of first electrodes and a plurality of second electrodes, wherein:
the first and second electrodes are crossly configured and electrically insulated from one another, and
each of the first and second electrodes includes a plurality of conductive structures;
defining a mark region located within a region containing the first and second electrodes;
at least partially removing at least one of the conductive structures from the mark region;
forming at least one transparent conductive element complementing the removed conductive structure and being electrically connected to a corresponding conductive structure outside the mark region and contained in either one first electrode or one second electrode; and
forming an alignment mark in the mark region.

16. The method of claim 15, wherein each first electrode includes a plurality of first conductive structures that are separated from one another, wherein the method further includes:
forming the first and second electrodes in a same layer,
forming a first insulating layer on the same layer containing the first and second electrodes,
electrically connecting at least two adjacent first conductive structures by a conductive bridge, wherein:
the conductive bridge is electrically connected to each of the two adjacent first conductive structures through a first via-hole formed in the first insulating layer,
the first insulating layer is between the conductive bridge and the same layer containing the first and second electrodes,
the transparent conductive element and the conductive bridge are formed in a single patterning process on the first insulating layer over a base substrate, and
the transparent conductive element is electrically connected to the corresponding conductive structure through a second via-hole formed in the first insulating layer.

17. The method of claim 16, wherein:
the transparent conductive element is configured to partially overlap with the corresponding, complemented conductive structure providing an overlapping edge region between the transparent conductive element and the corresponding, complemented conductive structure, and
the second via-hole formed in the first insulating layer is configured through the overlapping edge region.

18. The method of claim 15, further including:
forming a light-shielding layer at an edge of the touch-control substrate to conceal wirings of the first and second electrodes, wherein the alignment mark is formed by an optically transparent material, and
forming a second insulating layer between the alignment mark and the transparent conductive element in the mark region.

19. The method of claim 15, further including:
forming each transparent conductive element outside of the alignment mark, or
forming each transparent conductive element to partially overlap with the alignment mark, or
forming each transparent conductive element to include the alignment mark.

20. The method of claim 15, wherein:
forming a conductive bridge to electrically connect adjacent first conductive structures in the plurality of first electrodes,
configuring four adjacent conductive bridges centered by the alignment mark and surrounding the mark region, wherein the alignment mark is in a center of the mark region, and
forming four transparent conductive elements in the mark region, having two transparent conductive elements each electrically connected to the corresponding, complemented conductive structure outside the mark region and contained in one of the plurality of first electrodes, and having two transparent conductive elements each electrically connected to the corresponding, complemented conductive structure outside the mark region and contained in one of the plurality of second electrodes,
wherein the four transparent conductive elements are centered by the alignment mark.

* * * * *